United States Patent
Burton et al.

(10) Patent No.: US 8,476,742 B2
(45) Date of Patent: Jul. 2, 2013

(54) FLUID EJECTION DEVICE COMPRISING SUBSTRATE CONTACT VIA

(75) Inventors: Gregory N. Burton, Camas, OR (US); Paul I. Mikulan, Carrollton, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 135 days.

(21) Appl. No.: 12/812,776

(22) PCT Filed: Feb. 28, 2008

(86) PCT No.: PCT/US2008/055395
§ 371 (c)(1),
(2), (4) Date: Jul. 14, 2010

(87) PCT Pub. No.: WO2009/108201
PCT Pub. Date: Sep. 3, 2009

(65) Prior Publication Data
US 2010/0320608 A1 Dec. 23, 2010

(51) Int. Cl.
*H01L 23/485* (2006.01)
(52) U.S. Cl.
USPC .............. 257/644; 257/774; 257/E23.011; 257/E21.577; 438/637; 438/666

(58) Field of Classification Search
USPC ............... 257/644, 774, E23.011, E21.537, 257/E21.577, E21.586; 438/597, 637, 666
See application file for complete search history.

(56) References Cited

U.S. PATENT DOCUMENTS

| | | | |
|---|---|---|---|
| 4,358,891 A | 11/1982 | Roesner | |
| 6,348,099 B1 | 2/2002 | Xia et al. | |
| 2002/0130371 A1* | 9/2002 | Bryant et al. | 257/379 |
| 2005/0020048 A1 | 1/2005 | Nemani et al. | |
| 2006/0071281 A1* | 4/2006 | Dodd et al. | 257/368 |
| 2007/0049035 A1 | 3/2007 | Tran | |

FOREIGN PATENT DOCUMENTS

| | | |
|---|---|---|
| EP | 0232508 A2 | 8/1987 |
| JP | 1990-040935 | 2/1990 |
| JP | 1993-243397 | 9/1993 |

* cited by examiner

*Primary Examiner* — Tom Thomas
*Assistant Examiner* — Christopher M Roland (57) ABSTRACT

Edges of a first conductive layer (104) and a silicate glass layer (106) extend adjacent one another along a via (164) extending to a semiconductor substrate (41). An electrical conductor (112/114) extends through the via (164) into contact with the semiconductor substrate (41).

20 Claims, 7 Drawing Sheets

FLUID EJECTION DEVICE COMPRISING SUBSTRATE CONTACT VIA

BACKGROUND

Electrical devices sometimes include semiconductor substrates to form electrical components such as transistors. High voltages and continuous operation sometimes result in a build up of charge in the substrate near the transistors which may decrease threshold voltages of the transistors and may lead to formation of a parasitic lateral bipolar transistor in the substrate. Draining built-up charge from the substrate near the transistors may reduce such issues. However, architectures for making electrical contact with the substrate may increase fabrication complexity, may increase fabrication cost may occupy valuable space and may lack satisfactory performance.

DETAILED DESCRIPTION OF THE EXAMPLE EMBODIMENTS

Figure 1:
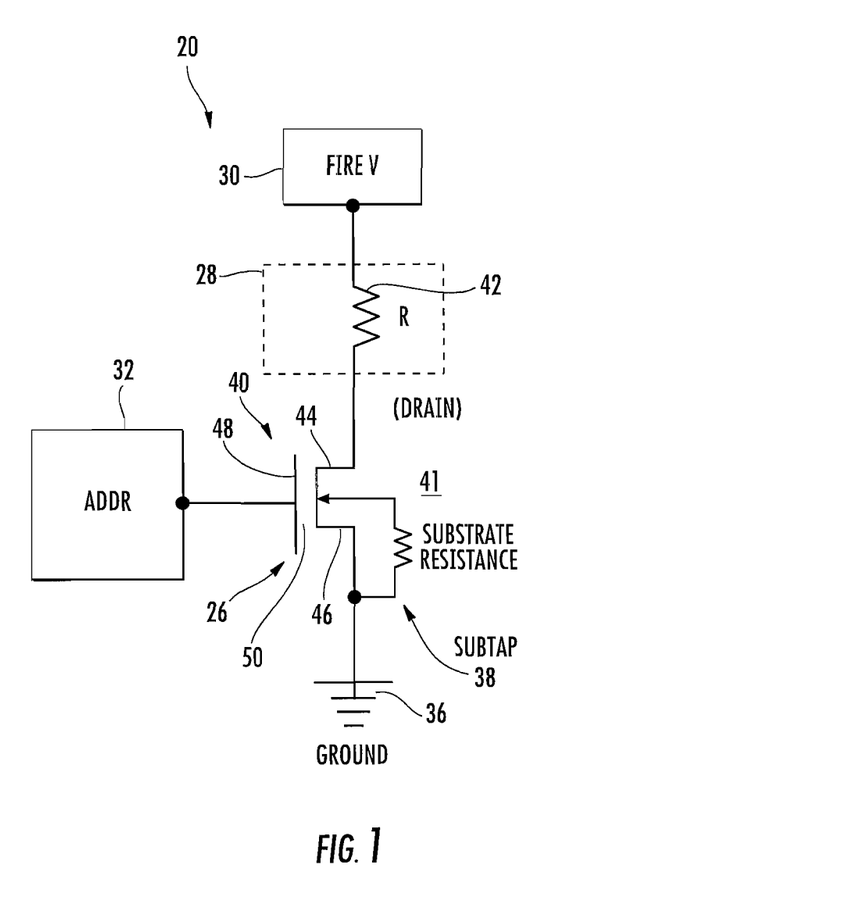
FIG. 1 is a circuit diagram schematically illustrating a fluid ejection device according to an example embodiment.
Figure 2:
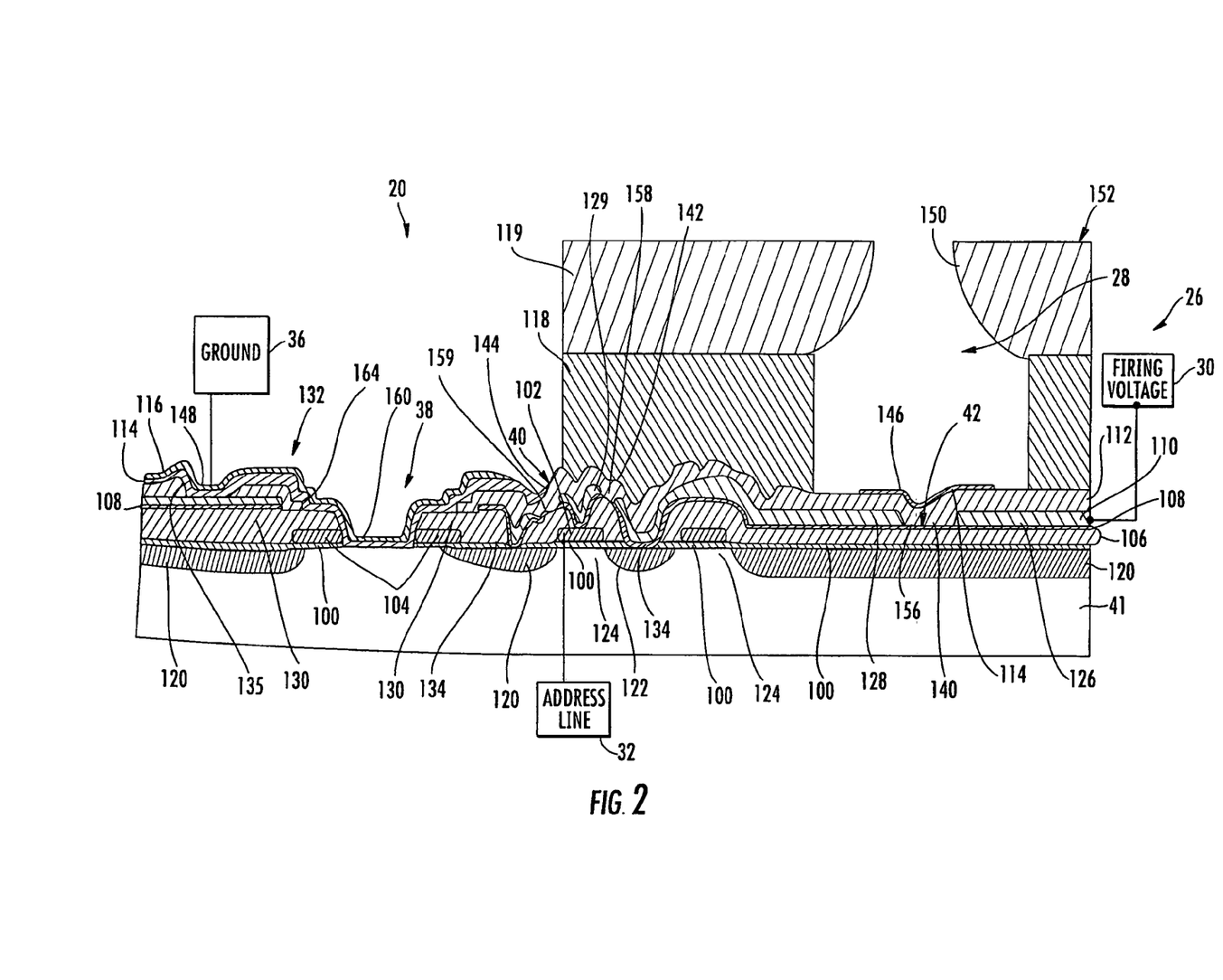
FIG. 2 is a sectional view of the fluid ejection device of FIG. 1 according to an example embodiment.

FIGS. 1 and 2 illustrates fluid ejection device 20 according to an example embodiment. FIG. 1 is a schematic of fluid ejection device 20. As will be described hereafter, fluid ejection device 20 includes a subtap architecture for draining electrical charge from its semiconductor substrate that is less complex, has low fabrication costs and provides satisfactory performance.

As schematically shown by FIG. 1, fluid ejection device 20 generally includes firing circuitry 26, firing chamber 28, firing voltage source 30, address line 32, ground 36 and subtap 38. Firing circuitry 26 comprises electrical components or elements supported by a substrate 41 and configured to selectively heat or fire a resistor opposite to firing chamber 28 such that fluid within firing chamber 28 is partially vaporized, forcing the remaining fluid out of firing chamber 28. As schematically shown by FIG. 1, firing circuitry 26 includes thin film transistor 40 and resistor 42. Transistor 40 includes a drain 44 connected to resistor 42, a source 46 connected to ground 36 and a gate 48 spaced from source 46 and drain 44 by a gate dielectric 50 and electrically connected to address line 32. Resistor 42 is electrically connected between drain 44 and firing voltage source 30. In operation, to eject fluid from a particular firing chamber 28, address line 32 provides electric charge to gate 48, electrically connecting drain 44 to source 46. As a result, electrical current from firing voltage source 30 flows across resistor 42 towards ground 36, heating resistor 42 so as to vaporize and eject fluid from firing chamber 28.

Sub tap 38 comprises an electrically conductive line, via, contact or structure is electrically connecting substrate 41 to ground 36. Sub tap 38 drains electrical charge that is built-up in substrate 41, particularly charge that is built-up about transistor 40. As a result, the reduction of threshold voltages of the transistors which may lead to formation of a parasitic lateral bipolar transistor in the substrate is reduced.

FIG. 2 is a cross-sectional view illustrating an example actual architecture for fluid ejection device 20. As shown by FIG. 2, fluid ejection device 20 includes substrate 41, dielectric layer 100, conductive layers 102, 104, silicate glass layer 106, electrical resistive layer 108, conductive layer 110, dielectric layer 112, conductive layers 114, 116, barrier layer 118 and orifice layer 119. In addition, as schematically shown, fluid ejection device 20 also includes firing voltage source 30, address line voltage source 32 and ground 36.

Substrate 41 comprises one or more layers configured to support firing circuitry 26, firing chamber 28 and sub tap 38. In particular, substrate 41 comprises one or materials configured to be selectively doped such that portions of the substrate 41 may be made more electrically conductive while other portions are left with higher resistivity in order to form transistors for firing circuitry 26. According to one example embodiment, substrate 41 comprises silicon, wherein the entire silicon substrate is lightly doped to have a moderate resistivity within tightly controlled specifications and wherein selected regions are more heavily doped so as to be more electrically conductive (regions 120 and 122 described hereafter). In other embodiments, substrate 41 may be formed from other semiconductor or semi-conductive materials.

In the example illustrated, substrate 41 has doped regions 120, 122 which are electrically conductive and lightly doped regions 124 between such doped regions 120, 122. Doped regions 120 serve as a source; doped regions 122 (enclosed by the gate structure of layer 102 in the form of a ring) serve as a drain and lightly doped regions 124 serve as channels in a transistor used to provide power to an associated firing chamber 28.

Dielectric layer 100 comprises one or more layers of dielectric material patterned over substrate 41. In one embodiment, layer 100 is formed in two stages. During the first stage, layer 100 is patterned such that layer 100 blocks subsequent heavier doping of underlying regions of substrate 41 such that layer 100 overlies and defines lightly doped regions 124. These regions of layer 100 further serve to locate and align subsequent formation of a single layer which provides layers 102 and 104. During the second stage, after formation of layers 102 and 104, and after doping to form regions 120 and 122, substrate 41 is oxidized to passivate surfaces of regions 120 and 122 to grow additional portions of layer 100.

In the example illustrated, dielectric layer 100 extends across substrate 41 except for at locations corresponding to sub tap 38 and the more doped regions 120, 122. Dielectric layer 100 electrically separates lightly doped regions 124, which serve as transistor channels, from the overlying gate of the transistors provided by conductive layer 102. The dielectric layer 100 is sufficiently thin such that electrical fields emitted from the gate provided by layer 102 make lightly doped regions 124 more electrically conductive. In the example illustrated, dielectric layer 100 comprises an oxidized surface of substrate 41. In the embodiment illustrated wherein substrate 41 comprises silicon, layer 100 comprises SiO2. In another embodiment, layer 100 may be formed-in other fashions or from other dielectric materials.

Conductive layers 102, 104 comprise one or more layers of electrically conductive material. Layers 102, 104 self align with portions of underlying layer 100 and inhibit or prevent subsequent etching away of the underlying portions of layer 100. Layer 102 overlies dielectric layer 100 and lightly doped regions 124 and serves as a gate of a transistor. In the example embodiment illustrated, layers 102 and 104 comprise polysilicon (also known as polycrystalline silicon, poly-Si or poly). Layers 102 and 104 (self aligned over the dielectric layer 100) are doped to a low conductivity in the same process step which dopes the junction areas 122, 124, while simultaneously preventing dopants from entering the channel regions 124 and subtap area 38. This reduces the number of processing steps used to create all of the circuit components.

In other embodiments, layers 102 and 104 may be formed from other materials configured to inhibit doping of underlying portions of substrate 41 that are also electrically conductive. In yet another embodiment, layers 102 may be merely electrically conductive, wherein dielectric layer 100 is formed from one or more layers configured to inhibit doping of substrate 41 when regions 120 are doped. In other embodiments, layer 104 may alternatively comprise a dielectric material configured to inhibit doping of underlying portions of substrate 41.

Silicate glass layer 106 comprises a layer of dielectric material overlying regions 120 of substrate 41, layers 102 and layers 104. Layer 106 has a relatively large thickness and electrically insulates regions 120 of substrate 41 from layers 102 and from resistive layer 108 and conductive layer 110. Because layers 106 is silicate glass, layers 106 may be more easily deposited and blanket coated across substrate 41 and layers 102, 104. In particular, the addition of phosphorus enhances the fluidity of the silicate glass forming layer 106 for enhanced coverage. In the example embodiment illustrated, silicate glass layer 106 is formed from polysilicate glass (PSG). In another embodiment, layer 106 may be formed from other forms of silicate glass such as borophosphosilicate glass (BPSG).

Resistive layer 108 comprises a layer of electrically resistant material deposited upon layer 106 at least within the area of firing chamber 28. Layer 108 serves as the resistor 42 which emits heat upon transmitting electrical current from firing voltage source 30. This heat emitted by layer 108 within the area of firing chamber 28 vaporizes a portion of fluid within the firing chamber 28, forcefully ejecting a remaining portion of fluid within firing chamber 28. In the example illustrated, layer 108 comprises a layer of Tantalum Aluminum (TaAl), a single layer of Ta and Al atoms co-sputtered together. In other embodiments, layer 108 may be formed from other resistant materials.

Conductive layer 110 (sometimes referred to as the metal 1 layer or metal 1 bus) comprise one or more layers of electrically conductive material including a first portion 126 which electrically connects portions of layer 108 to firing voltage source 30, a second portion 128 which electrically connects a second spaced portion of layer 108 to regions 122 which serve as a drain of the transistor 40, a third portion 129 which is in contact with layer 102 and electrically connects layer 102 to address line voltage source 32, and a fourth portion 130 which electrically connects to region 120 of substrate 41 (serving as the source of the transistor 40) and extends around sub tap 38 (into the page) to electrically connect region 120 to bond pad 132 which is connected to ground 36. Region 128 of layer 110 is in electrical connection with regions 122 of substrate 41 across adjacent portions of layer 108 and through vias 134 formed through layers 106 and 100. In one embodiment, vias 134 are formed by drilling down through layers 106 and layer 100. In the example illustrated, layer 110 is formed from an aluminum layer. According to one embodiment, layer 110 is patterned together with layer 108 except for the area of resistor 42. In other embodiments, layer 110 may be formed from other electrically conductive materials.

Dielectric layer 112, sometimes referred to as a passivation layer, comprises one or more layers of dielectric material extending over layer 110 and electrically insulating or isolating portions of layer 110. In the example illustrated, layer 112 includes regions 140, 142 and 144. Region 140 extends through layer 110 into contact with layer 108, electrically separating portions 126 and 128 of layer 110. Region 142 extends through layer 110 to layer 106, electrically separating region 128 from region 1-29 of layer 110. Region 144 extends through layers 110 to layer 106, separating region 129 from region 130 of layer 110. According to one example embodiment, dielectric layer 110 may comprise consecutive layers of SiC and SiN. In other embodiments, dielectric layer 110 may include other materials and have greater or fewer dielectric layers.

Conductive layer 114 comprises a patterned layer of electrically conductive material. Layer 114 includes regions 146 and 148. Region 146 (sometimes referred to as a cavitation layer) extends over and in contact with layer 112 within firing chamber 28 and opposite to portions of layer 108 forming resistor 42. Region 146 protects resistor 42 formed by layer 108 and portions of layer 112 from damage from bubble collapse in chamber 28 after fluid ejection. Region 148 extends through a via 135 in layer 112 into contact with region 130 of layer 110 and provides electrical connection between region 130 of layer 110 and layer 116 of bond pad 132. In the example illustrated, region 148 further extends through via in layer 112, layer 106 and layer 104 into contact with an lightly doped portion of substrate 41 to provide a part of sub tap 38. In the example illustrated, layer 114 is formed from tantalum. In other embodiments, layer 114 may be formed from other metals such as tungsten or molybdenum.

Layer 116 comprises a layer of electrically conductive material patterned over region 148 of layer 114. Layer 116 has a relatively lower resistance as compared to layer 114. Layer 116 forms a surface of bond pad 132. Layer 116 further serves as part of an electrically conductive layer extending to substrate 41 to provide sub tap 38. In the example illustrated, layer 116 comprises a layer of gold. In other embodiments, layer 116 may be formed from other electrically conductive materials having relatively low electrical resistance. In some embodiments, layer 116 may deposited directly in contact with region 130 and substrate 41, where region 148 of layer 114 is omitted.

Layer 118, sometimes referred to as a barrier layer, comprises one or more layers of material which are patterned so as to form firing chamber 28 about region 146 of layer 114 and about resistor 42. Layer 119, sometimes referred to as an orifice plate, comprising one or more layers extending over layer 118 and configured to define nozzle openings 150 of firing chamber 28. Layers 118 and 120, together, form orifice structure 152. Although orifice structure 152 is illustrated as being formed from two layers, orifice structure 152 may alternatively be formed from a single layer or from greater than two layers. Orifice structure 152 may be formed from various polymers, epoxy materials, metals and the like.

According to one example embodiment, fluid ejection device 28 may be formed with the following process. Dielectric layer 100 is initially formed upon substrate 41 comprising p-type silicon substrate 41. In one embodiment, layer 100 is formed through oxide growth. Thereafter, layers 102 and 104, comprising polysilicon, are deposited as a single continuous layer across substrate 41 and over layers 131. In one embodiment, layers 102 and 104 are deposited by low pressure chemical vapor deposition (LPCVD). Thereafter, the single continuous layer is patterned and etched to form layers 102 and 104. Layer 41 is then doped to form regions 120 and 122. As noted above, layer 102 inhibits doping of regions 124, while layer 104 inhibits doping of portions substrate 41 below sub tap 38.

After such doping, silicate glass layer 106 is deposited followed by solidification or densification. In one embodiment, layer 106 is deposited by atmospheric pressure chemical vapor deposition (APCVD). As shown by FIG. 2, portions of layer 106 are patterned and etched to form vias 134 and to expose a top surface of layer 104. Thereafter, layers 108 and 110 are deposited. In one embodiment, layers 108 and 110 are deposited by sputtering. After such deposition, portions of layers 110 and 108 are patterned and etched to form openings 158 and 159 extending into contact with layer 106 and to form opening 160 extending through layers 110 and additionally extending through layers 104 into contact with substrate 41. Thereafter, portions of layer 110 are patterned and etched to form opening 156 extending into contact with layer 108 (between regions 126 128), Upon the formation of such openings or gaps, layer 112 is deposited. In one embodiment, layer 112 is deposited by sputtering. As shown by FIG. 1, portions of layer 112 are further patterned and etched to form via 164 extending through layers 112 into contact with substrate 41. Via 164 overlies the previously formed opening 160.

Once via 164 is formed, layers 114 and 116 are deposited. In one embodiment, such layers are deposited by sputtering. Thereafter, such layers are patterned and etched to form regions 140 and 142. After the aforementioned firing circuitry 26 has been formed, orifice structure 152 is formed about resistor 42 to form firing chamber 28 and nozzle opening 150. In other embodiments, one or more such layers may be omitted or one or more additional layers may be added. In other embodiments, the process may be varied.

Figure 3:
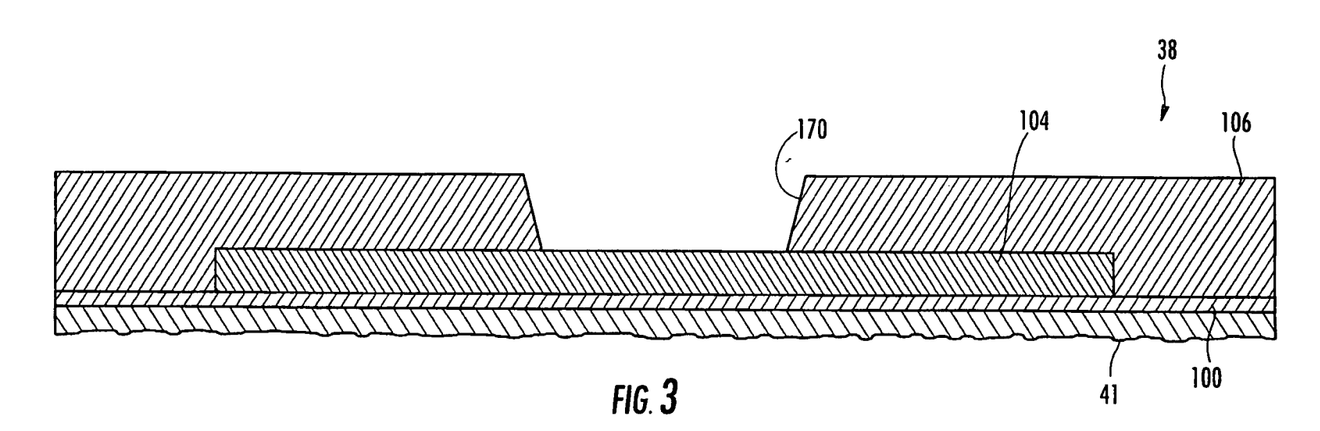
FIGS. 3-6 are sectional view as schematically illustrating forming of a sub tap in the fluid ejection device of FIG. 1 according to example embodiment.

FIGS. 3-6 illustrate the forming of sub tap 38 (shown in FIG. 1) in more detail. FIG. 3 illustrates the region of sub tap 38 in FIG. 1 after layer 104 has been deposited and patterned over layer 100. FIG. 3 further illustrates the region of sub tap 38 after silicate glass layer 106 has been deposited and patterned to form an opening 170 in layer 106.

Figure 4:
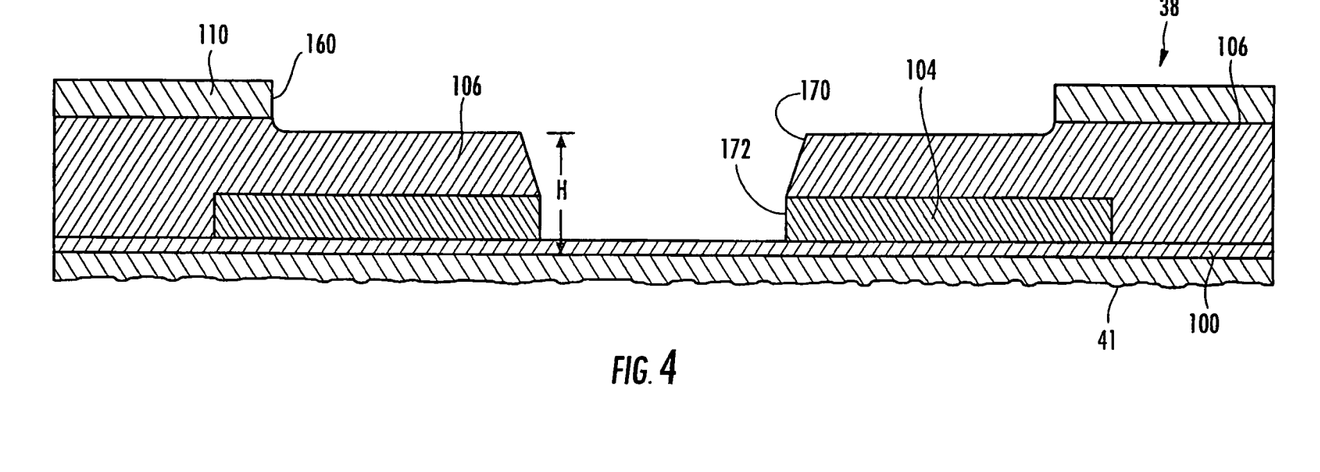

FIG. 4 illustrates the region of sub tap 38 after layer 110 has been deposited and portions of layer 110 have been removed, such as by etching, to form opening 160. As shown by FIG. 4, additional, further or over etching (additional etching performed after opening 160 through layer 110 is formed) further removes portions of layer 104 to expose layer 100 through opening 170. During such etching, layer 106 functions as a hard mask by controlling the size and location of opening 172 through layers 104 which is in substantial line with opening 170. During such etching, opening 170 may slightly increase in size as well. Because layer 106 serves as a hard mask, the number of photolithography steps forming sub tap 38 may be reduced. As a result, fabrication time and cost may be reduced. In addition, the risk of misalignment of the openings through layer 106, layer 104 and layer 100 is reduced.

As further shown by FIG. 4, during such etching (or other removable processes) of layer 110 to form opening 160, top portions of layer 106, exposed by removed portions of layer 110, are also removed. Such over etching of layer 110 reduces the thickness of layer 106 about openings 170 and 172. In one embodiment, such over etching removes approximately 1000 Angstroms of layer 106. As a result, the overall step height H (the height between the top of layer 106 and substrate 41 is reduced. Layers 114 and 116, which are subsequently deposited, have improved coverage facilitating enhanced draining of electrical charge by sub tap 38 and enhanced structural integrity in the presence of subsequent chemical process steps. In particular, the improved coverage of layers 114 and 116 inhibits subsequent chemical process steps from attacking the aluminum, PSG and/or polysilicon layers which exist below the "tent" provided by layers 114/116. This enhanced protection also benefits the final printhead, where corrosive ink vapors may attack aluminum and PSG through any cracks or pin holes in layers 114/116.

Figure 5:
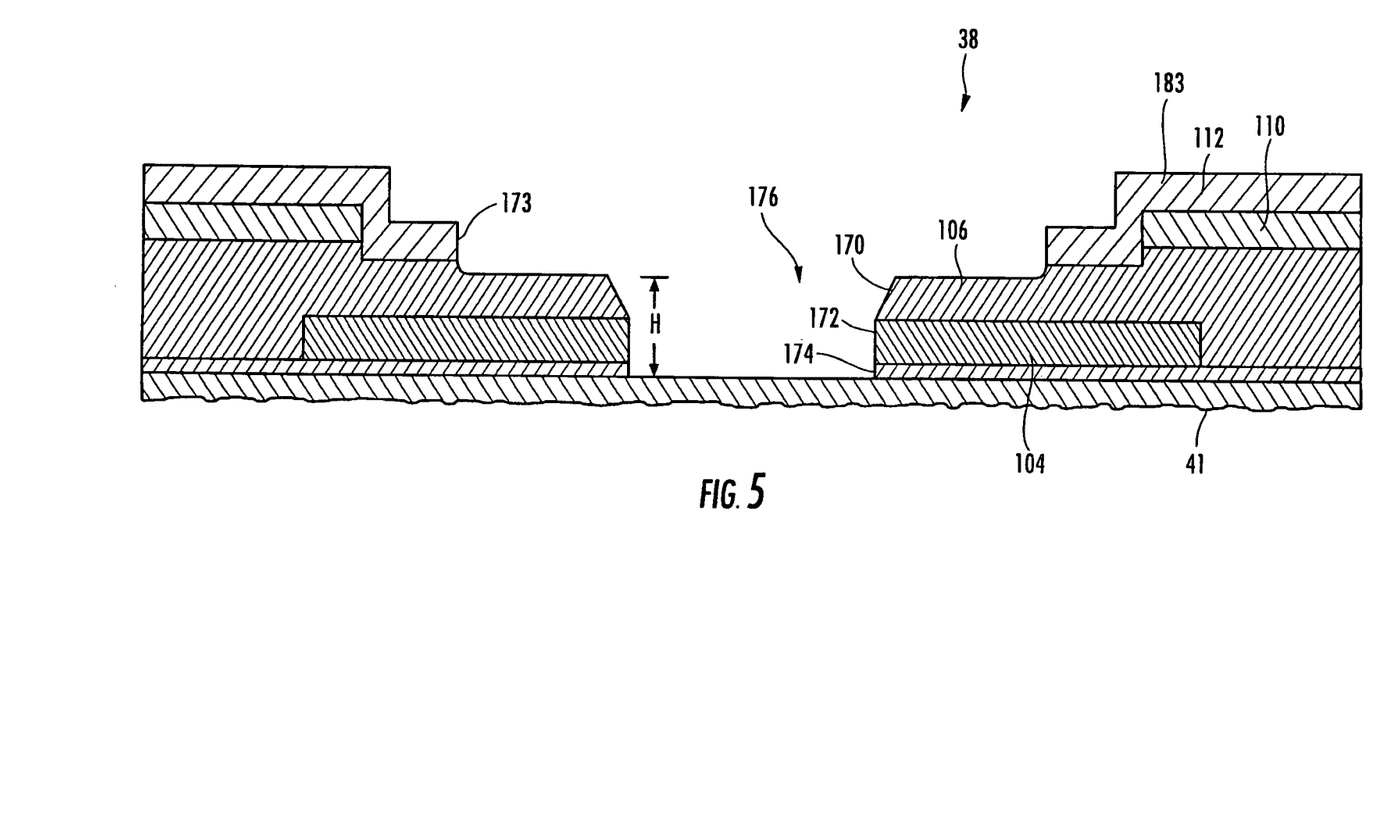

FIG. 5 further illustrates the region of sub tap 38 after layer 112 has been deposited and portions have been removed (such as by photolithographic patterning and etching). As shown by FIG. 5, portions of layer 112 are removed to form an opening 173 through layer 112. Exposed portions of layer 112 are over etched to additionally remove exposed portions of layer 100 to form opening 174 through layer 100. Opening 174 is largely aligned with openings 172 and 170 to complete the total opening 176 extending to substrate 41. Once again, layer 106 serves as a hard mask for the etching and removal of portions of layer 100 to form via 176 exposing substrate 41.

As further shown by FIG. 5, during such removal or over etching of layer 112, an additional thickness of layer 106 is removed. In one embodiment, an additional thickness of approximately 2000 Angstroms of layer 106 is removed to further reduce the step height H of via 176 forming sub tap 38. As a result, layers 114 and 116, which are subsequently deposited, have a further improved coverage facilitating enhanced draining of electrical charge by sub tap 38.

Figure 6:
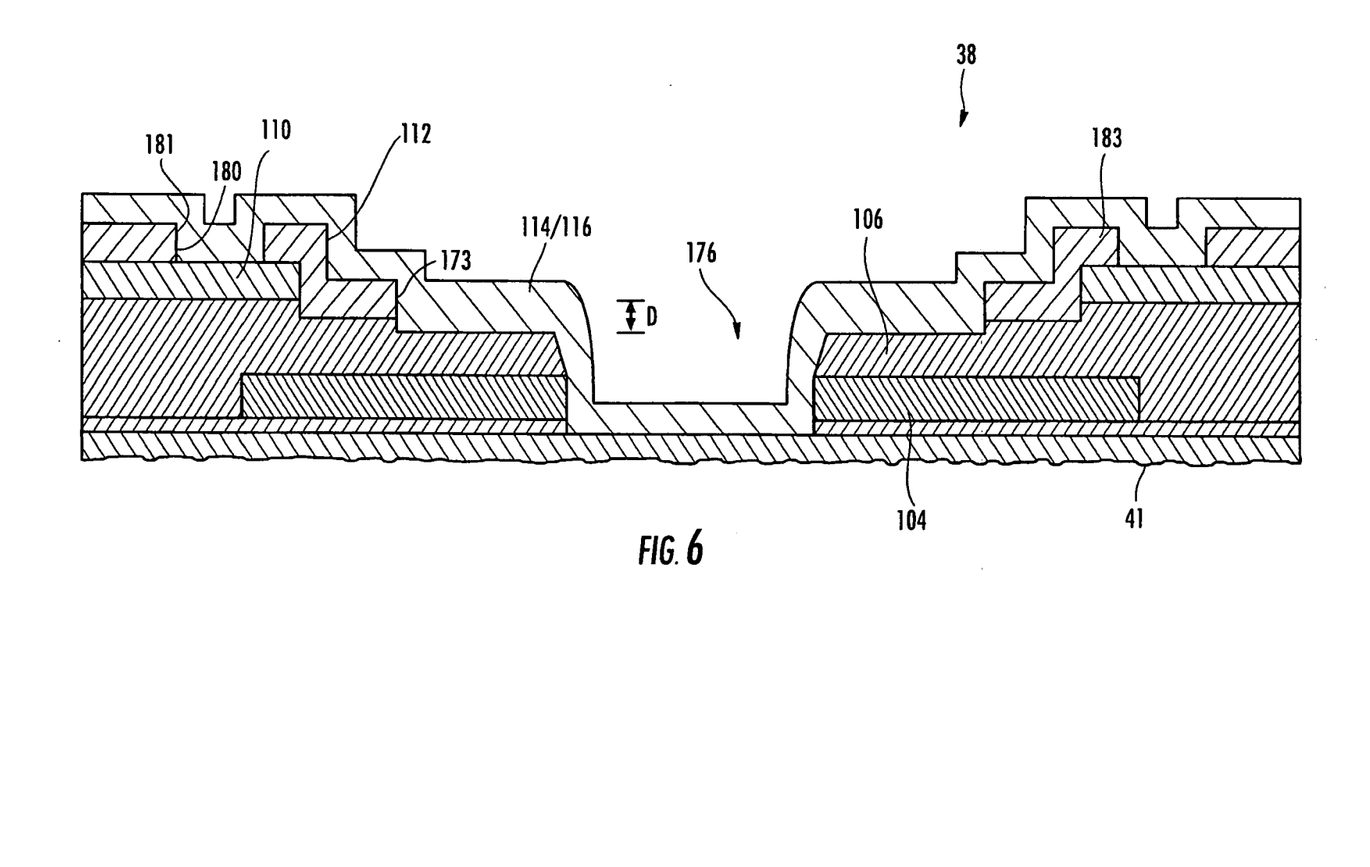

FIG. 6 illustrates the region of sub tap 38 after the deposition of layers 114 and 116 (which are sometimes collectively referred as the metal 2 layer or metal 2 bus). In one embodiment, layers 114, 116 are deposited by sputtering. In other embodiments, deposition may be achieved in other fashions. As shown by FIG. 6, according to one example embodiment, a via 180 through layers 112 and in contact with layer 110 is formed through photolithography and subsequent plasma etching. As a result, layers 114, 116 are electrically connected to layer 110 (as also shown in FIG. 1, below bond pad 132).

As further shown by FIG. 6, layers 114, 116 extend over layer 112 along the adjacent edges of layers 106, 104 and 100 into electrical contact with substrate 41. As shown by FIG. 6, the removal of layer 106 during over etching of layer 110 and layer 112 reduces the step height of layers 114,116 (metal 2 layer). In the example illustrated, the step of layer 114/116 is actually below the step of layer 110 (metal 1) by a distance D of at least about 3000 angstroms. As a result, layers 114/116 have enhanced step coverage.

Overall, the above-described sub tap 38 and the described process for forming sub tap 38 offers several advantages. Because layer 106 serves as a hard mask for controlling the size and location of the sub tap via, soft masks for photolithographically defining such vias may be omitted, reducing fabrication cost and time. In addition, misalignment risks are reduced. By reducing misalignment risks, the positioning of sub tap 38 may be more precisely controlled, allowing sub tap 38 to be placed in closer proximity to transistor 44. This enhances the sub tap effectiveness (performance), while also permitting the overall surface area of sub tap 38 to be reduced.

In addition, because the thickness of portions of layer 106 (generally the thickest of the layers of the electrical circuitry formed upon substrate 41) about via 176 of sub tap 38 are erroded during the over etching of layers 110 and 112, step height is reduced and the contact angles reduced along the via edges of layers 114, 116. As a result, layers 114, 116 have improved coverage, enhancing the ability of sub tap 38 to drain electrical charge from substrate 41. In addition, enhanced structural integrity in the presence of subsequent chemical process steps is achieved. In particular, the improved coverage of layers 114 and 116 inhibits subsequent chemical process steps from attacking the aluminum, PSG and/or polysilicon layers which exist below the "tent" provided by layers 114/116. This enhanced protection also benefits the final printhead, where corrosive ink vapors may attack aluminum and PSG through any cracks or pin holes in layers 114/116.

Figure 7:
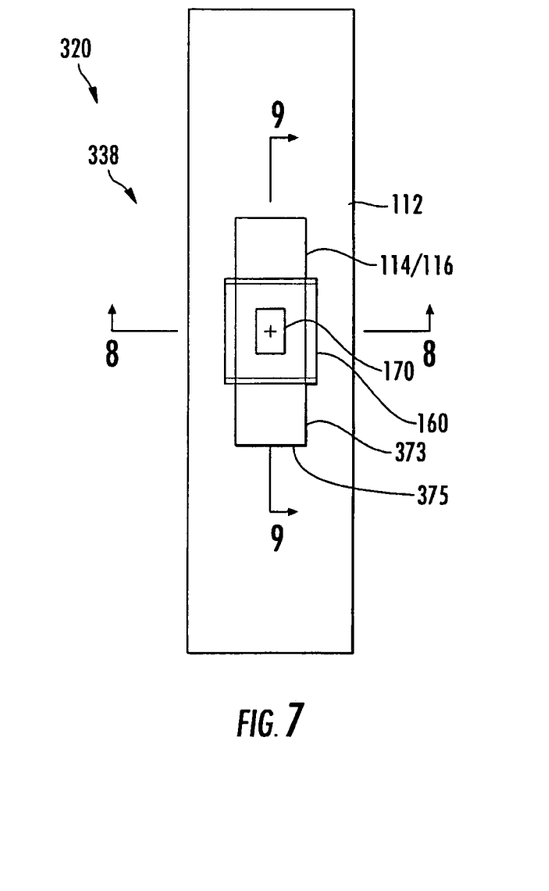
FIG. 7 is a top plan view of another embodiment of the sub tap of the fluid ejection device of FIG. 1 according to an example embodiment.
Figure 8:
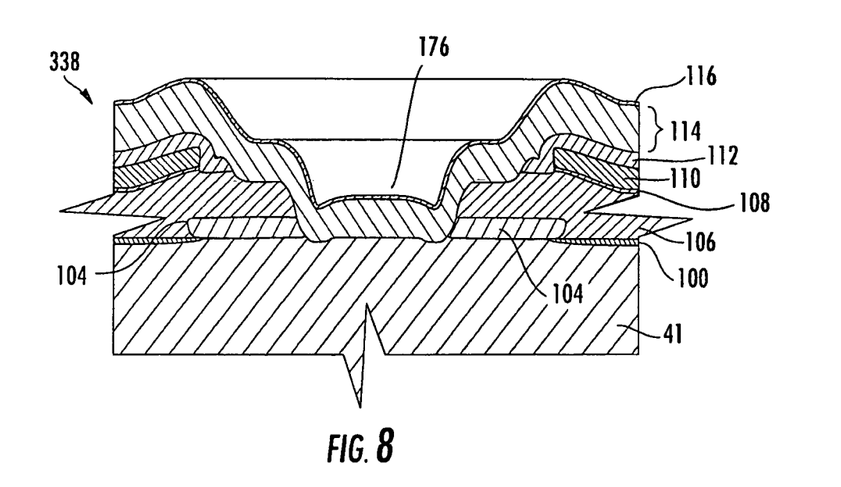
FIG. 8 is a sectional view of the sub tap of FIG. 7 taken along the lines 8-8 according to example embodiment.
Figure 9:
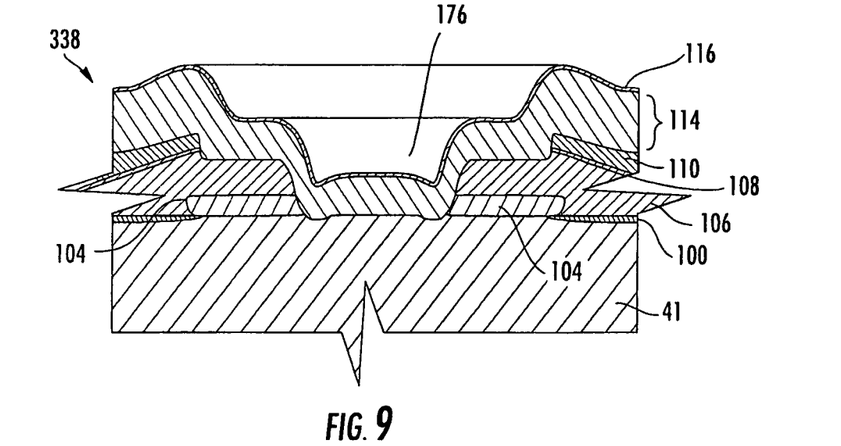
FIG. 9 is a sectional view of the sub tap of FIG. 7 taken along lines 9-9 according to an example embodiment.

FIGS. 7-9 illustrate sub tap 338 of fluid ejection device 320, another embodiment of subtap 38 shown in FIGS. 1 and 2. Fluid ejection device 320 is substantially identical to fluid ejection device 20 except that fluid ejection device 320 includes sub tap 338 in place of sub tap 38. The remaining elements of fluid ejection device 320 are shown in FIG. 1. FIG. 7 is a top plan view of the region of sub tap 338 without layers 114/116. FIGS. 8 and 9 are sectional views of the region including layers 114,116.

Sub tap 338 is similar to sub tap 38 except that sub tap 338 replaces two vias by one long via which covers the whole structure, allowing sub tap 338 to be more compact. Instead, portion 183 (shown in FIG. 6) of layer 112 extending along an inner edge of layer 110 about the via 176 formed by openings 170, 172 and 174 is omitted such that layers 114, 116 contacts portions of a top and side edges of layer 110 about via 176. In particular, as shown by FIG. 7, opening 173 (shown in FIG. 6) through layer 112 is widened to form opening 373. In one embodiment, edge 375 of opening 373 may correspond with the outer edge 181 of via 180 of sub tap 38 shown in FIG. 6. As a result, sub tap 338 occupies even less surface area or real estate.

According to one example embodiment, opening 160 through layer 110 is approximately 6 μm by 8 μm. Opening 373 through layer 112 is approximately 6 μm by 20 μm. As a result, layers 110 and layers 114, 116 overlap one another over an area of 6 μm by 6 μm on each side of opening 160. Because sub tap 338 has reduced width of less than 9 μm and nominally about 8 μm, the electrically conductive bus line for layers 110 may also have a reduced width, conserving valuable real estate.

As further shown by FIGS. 8 and 9, during over etching of layer 110 and layer 112, side edges of layer 106 become widened and tapered. As a result, rather than being approximately 90 degrees, the profile or contact angle A is reduced to below 75 degrees. In one embodiment, the contact angle is reduced to approximately 70 degrees. This reduced contact angle further enhances the coverage of layers 114,116 over the edges of layers 104 and 106 to enhance the ability of sub tap 338 to drain electrical charge from substrate 41. Sub tap 38, shown in FIG. 1, also has a contact angle of less than a 75 degrees and nominally about 70 degrees. Like sub tap 38, sub tap 338 provides enhanced alignment and reduces misalignment risks, produces a gentle step height and reduces the overall area required for the region of sub tap 38.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. An apparatus comprising:
a semiconductor substrate;
a first conductive layer on the substrate;
a silicate glass layer on the first conductive layer, the silicate glass layer and the first conductive layer having edges along a via extending to the substrate;
a second conductive layer on the silicate glass layer;
a dielectric layer on the second conductive layer; and
a third conductive layer on the dielectric layer, the third conductive layer in electrical contact with the second conductive layer and extending through the via into electrical contact with the substrate, wherein the second conductive layer has edges about the via outwardly spaced from the edges of the first conductive layer.

2. The apparatus of claim 1, wherein the semiconductor substrate comprises silicon.

3. The apparatus of claim 1, wherein the first conductive layer comprises polysilicon.

4. The apparatus of claim 1, wherein the edges have a profile angle of less than or equal to 70 degrees.

5. The apparatus of claim 1, wherein the silicate glass layer has a first surface under the second conductive layer that is spaced from the substrate by a first distance and a second surface under the third conductive layer that is spaced from the substrate by a second lesser distance.

6. The apparatus of claim 1 further comprising a second dielectric layer between the first conductive layer and the silicon layer, wherein the via extends through the second dielectric layer.

7. The apparatus of claim 1, wherein the second conductive layer comprises Tantalum.

8. The apparatus of claim 1, wherein portions of the substrate are doped and wherein the portions form at least one transistor.

9. The apparatus of claim 1 further comprising a resistive portion, wherein the second conductive layer is on the resistive portion.

10. The apparatus of claim 9 further comprising:
an opening through the second conductive layer to the resistive portion;
a fluid cavity opposite the opening; and
a nozzle aperture in communication with the fluid cavity.

11. The apparatus of claim 1, wherein the dielectric layer covers edges of the second conductive layer proximate the via.

12. The apparatus of claim 11, wherein the dielectric layer extends from above the second conductive layer to below the second conductive layer across the edges of the second conductive layer.

13. The apparatus of claim 1, wherein the third conductive layer covers and contacts edges of the first conductive layer and the silicate glass layer proximate the via.

14. The apparatus of claim 1, wherein the second conductive layer has edges about the via outwardly spaced from the edges of the silicate glass layer.

15. The apparatus of claim 14, wherein the edges of the second conductive layer are noncontiguous with respect to the edges of the silicate glass layer.

16. The apparatus of claim 1, wherein the second conductive layer has edges about the via that have a width of less than or equal to about 9 microns.

17. The apparatus of claim 1, wherein the edges of the silicate glass layer and the first conductive layer contiguously extend from one another.

18. The apparatus of claim 1, wherein the edges of the silicate glass layer and the first conductive layer along the via are adjacent to one another.

19. An apparatus comprising:
a semiconductor substrate;
a first conductive layer on the substrate;
a silicate glass layer on the first conductive layer, the silicate glass layer and the first conductive layer having edges along a via extending to the substrate;
a second conductive layer on the silicate glass layer;
a dielectric layer on the second conductive layer; and
a third conductive layer on the dielectric layer, the third conductive layer in electrical contact with the second conductive layer and extending through the via into electrical contact with the substrate, wherein the third conductive layer covers and contacts edges of the first conductive layer and the silicate glass layer proximate the via.

20. An apparatus comprising:
a semiconductor substrate;
a first conductive layer on the substrate;
a silicate glass layer on the first conductive layer, the silicate glass layer and the first conductive layer having edges along a via extending to the substrate;
a second conductive layer on the silicate glass layer;
a dielectric layer on the second conductive layer; and
a third conductive layer on the dielectric layer, the third conductive layer in electrical contact with the second conductive layer and extending through the via into electrical contact with the substrate, wherein the dielectric layer covers edges of the second conductive layer proximate the via and wherein the dielectric layer extends from above the second conductive layer to below the second conductive layer across the edges of the second conductive layer.

* * * * *